(12) United States Patent
Yamagata (10) Patent No.: US 7,220,667 B2
(45) Date of Patent: May 22, 2007

(54) SEMICONDUCTOR DEVICE AND METHOD OF FABRICATING THE SAME

(75) Inventor: Osamu Yamagata, Kanagawa (JP)

(73) Assignee: Sony Corporation (JP)

( * ) Notice: Subject to any disclaimer, the term of this patent is extended or adjusted under 35 U.S.C. 154(b) by 201 days.

(21) Appl. No.: 10/998,651

(22) Filed: Nov. 30, 2004

(65) Prior Publication Data

US 2005/0093095 A1   May 5, 2005

Related U.S. Application Data

(62) Division of application No. 10/637,509, filed on Aug. 11, 2003, now Pat. No. 6,858,892.

(30) Foreign Application Priority Data

Aug. 14, 2002 (JP) ............................. P2002-236453

(51) Int. Cl.
*H01L 21/4763* (2006.01)
*H01L 29/76* (2006.01)
(52) U.S. Cl. ...................................... 438/637; 257/300
(58) Field of Classification Search ................ 257/300, 257/379, 516, 724; 438/123, 598, 629, 637, 438/667, 672
See application file for complete search history.

(56) References Cited

U.S. PATENT DOCUMENTS 6,274,937 B1 * 8/2001 Ahn et al. .................. 257/777
6,418,029 B1 * 7/2002 McKee et al. .............. 361/760
6,617,681 B1 * 9/2003 Bohr .......................... 257/700
2003/0199123 A1 * 10/2003 Siniaguine .................. 438/118

* cited by examiner

*Primary Examiner*—Calvin Lee
(74) *Attorney, Agent, or Firm*—Rader Fishman & Grauer PLLC; Ronald P. Kananen (57) ABSTRACT

A SiP (System-in-Package) having large-capacity passive elements incorporated therein or mounted thereon is provided. On an interposer made of a silicon substrate, metal substrate or glass substrate having via-holes formed therein, IC chips, or a plurality of chips, passive elements formed on a silicon substrate, metal substrate or glass substrate, are mounted in a face-up manner and re-wired en bloc on the chip. Because all of the silicon substrate, metal substrate and glass substrate are durable against high-temperature annealing for crystallizing a high-dielectric-constant material, large-capacity passive elements can be formed on the substrate which serves as an interposer or on the re-wiring of the chips to be mounted. It is also allowable that large-capacity passive elements formed on the silicon substrate, metal substrate or glass substrate is divided into chips, and that the resultant chips are mounted together with the IC chips.

21 Claims, 9 Drawing Sheets

PRIOR ART

SEMICONDUCTOR DEVICE AND METHOD OF FABRICATING THE SAME

CROSS REFERENCES TO RELATED APPLICATIONS

This application is a Division of U.S. application Ser. No. 10/637,509, filed Aug. 11, 2003 and issued as U.S. Pat. No. 6,858,892. The present invention claims priority to its priority document No. 2002-236453 filed in the Japanese Patent Office on Aug. 14, 2002, the entire contents of which being incorporated by reference herein.

BACKGROUND OF THE INVENTION

1. Field of the Invention

The present invention relates to a semiconductor device and a method of fabricating the semiconductor device, and in particular to a semiconductor device and a method of fabricating the semiconductor device capable of embedding or mounting large-capacity passive elements such as a decoupling capacitor.

2. Description of the Related Art

A technique for modularizing a plurality of IC chips and passive elements such as an inductor, capacitor and resistor on a single plane has long been adopted in the field of hybrid ICs. This technique was, however, not so advantageous in terms of attainable size and cost, because IC chips and passive elements were mounted on a printed board or ceramic substrate in a form of packaged chip.

Figure 15:
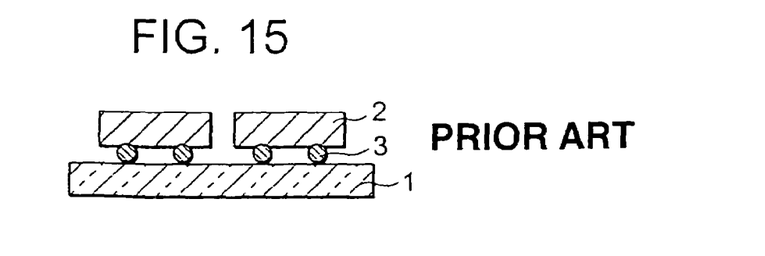
FIG. 15 is a schematic sectional view showing a prior art.
Figure 16:
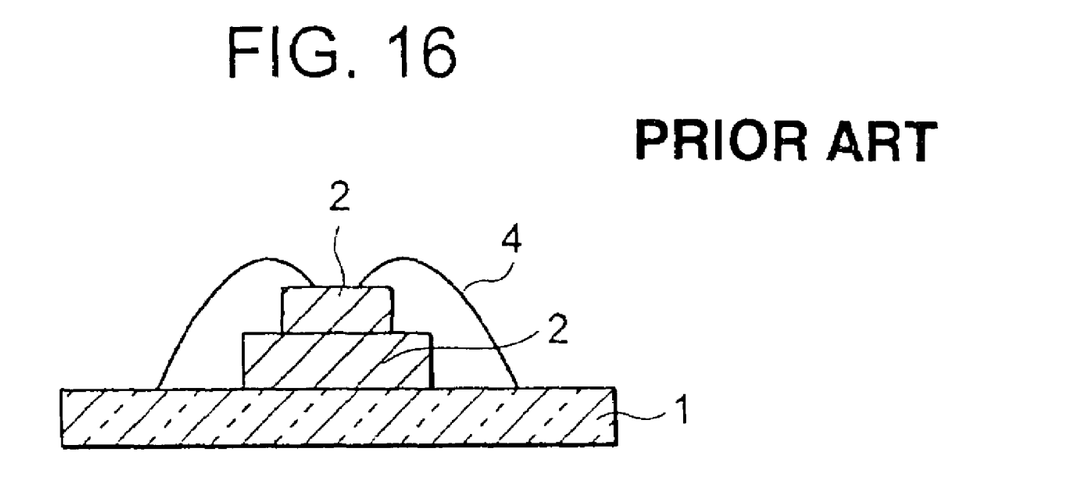
FIG. 16 is a schematic sectional view showing another prior art.
Figure 17:
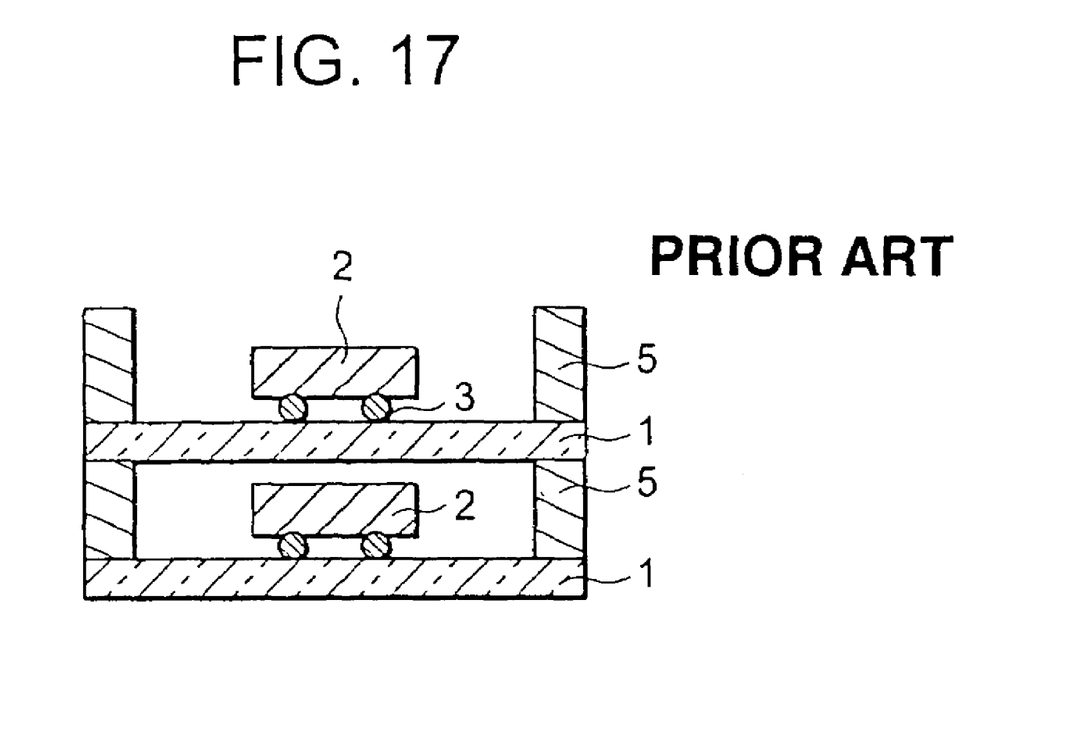
FIG. 17 is a schematic sectional view showing still another prior art.

As measures for satisfying a need for miniaturization, memory-chips developed thereafter and put into practical use for memory chips for laptop computers and mobile telephones have configurations shown in FIGS. 15 through 17, which relate to a flip-chip structure in which bear IC chips 2 are mounted upside down (face-down) on a substrate which is a printed board or a ceramic substrate, while placing external terminals 3 in between (FIG. 15); a multi-layer chip structure in which the IC chip 2 is stacked on the substrate 1 and bonded thereto through wires 4 (FIG. 16); and an interposer-type multilayer substrate structure in which the substrates 1 having the IC chip 2 mounted thereon are stacked while placing connection terminals 5 in between (FIG. 17).

Besides the conventional structures shown in FIGS. 15 through 17, other efforts have been made in order to cope with multi-chip modularization for high-frequency devices, by which inductors (L), capacitors (C) and resistors (R) are fabricated in an organic substrate or an inorganic substrate to thereby form a filter circuit, Barun circuit or switch circuit.

The capacitor (C) fabricated in the organic substrate, however, cannot use high-dielectric-constant materials since it is not durable against high-temperature annealing, and available materials are limited to insulating polyimide (PI), polyamide (PA), benzocyclobutene (BCB), poly-p-phenylenebenzobisoxazole (PBO) or the like. The capacity is thus limited to as small as 10 fF/$\mu m^2$. The inductor (L) can only have an inductance of as small as 10 nH while being restricted by warping of the substrate, thin-film structure thereof, and technical limit of etching. The resistor (R) can be fabricated anyhow, but trimming will be necessary in a matching circuit, and this makes the incorporation unpractical. Another disadvantage resides in that the film formation for fabricating the L, C, R is carried out in separated processes, and this makes the device have a multi-layered substrate structure and increases the cost. On the other hand, the ceramic substrate, often composed of a low-temperature-cofired ceramic (LTCC), is difficult to be stacked with different kinds of materials, so that characteristics of the capacitor (C) are inevitably determined by a dielectric constant of an LTCC to be used therefor. It is also disadvantageous that use of a high-dielectric-constant material undesirably increases the delay time and ruins the high-frequency characteristics.

SUMMARY OF THE INVENTION

The present invention is conceived after considering the aforementioned problems in multi-chip modularization of high-frequency devices. It is desirable to provide a semi-conductor device which allows large-capacity passive elements such as decoupling capacitors to be formed on a substrate.

It is also desirable to provide a semiconductor and a method of fabricating the semiconductor capable of satisfying needs for improved high-frequency characteristics and miniaturized multi-chip modules, by mounting a plurality of IC chips and passive elements on a substrate which serves as an interposer in a face-up manner, and by mutually connecting the chips by wiring.

A semiconductor device according to a first aspect of the present invention has passive elements formed on one of a silicon substrate, metal substrate and glass substrate.

The first aspect of the present invention is successful in forming a large-capacity capacitor such as a decoupling capacitor, because high-dielectric-constant materials, which need high-temperature annealing for crystallization after the film formation, can be formed on one of a silicon substrate, metal substrate and glass substrate which can endure the annealing.

A second aspect of the present invention has a plurality of IC chips, or a plurality of chips formed on one of a silicon substrate, metal substrate and glass substrate, mounted on an interposer made of one of a silicon substrate, metal substrate and glass substrate, wherein the plurality chips are passive elements.

The second aspect of the present invention is successful in configuring a multi-chip module capable of housing a large-capacity passive element in an on-chip style, which is realized by composing an interposer using a silicon substrate, metal substrate or glass substrate, which can endure the high-temperature annealing for crystallizing high-dielectric-constant materials, and on which passive elements such as a large-capacity capacitor and an inductor can be formed; and by forming the passive elements in a form of chip on one of a silicon substrate, metal substrate and glass substrate. It is to be noted that the substrate of the passive elements mounted as a chip is composed of the same kind as the substrate of the interposer, it is successful in realizing a multi-chip module having only a small difference in heat expansion and a low distortion.

A third aspect of the present invention has the chips mounted in a face-up manner. A fourth aspect of the present invention has the chips mounted on the interposer, which are mutually connected through a re-wiring.

The third and fourth aspects of the present invention are successful in miniaturizing the multi-chip module having high-frequency characteristics, which is realized by mounting chips (IC chips, or passive elements formed on one of the silicon substrate, metal substrate and glass substrate) in a face-up manner so as to reduce wiring resistance and wiring length, and by providing connection through re-wiring en bloc. Adoption of the face-up mounting can bring the re-wiring between the chips apart from wirings formed on the interposer, and thus facilitates prevention of digital-analog interference. Metal used herein for the re-wiring is preferably copper, which is effective for improving transmission delay characteristics.

A fifth aspect of the present invention is a modification of the semiconductor device according to the second aspect, where the interposer has via-holes formed therein so as to penetrate it, and where the via-holes are filled with a conductive material.

The fifth aspect of the present invention is successful in obtaining a bonded structure or multilayer structure while placing the interposer in between, because patterns for connection with the chips mounted on the interposer can be formed on the back surface of the interposer.

A sixth aspect of the present invention is a modification of the semiconductor device according to the third aspect, where via-holes are formed at gaps between adjacent chips on the interposer, the gaps being filled with an insulating material, and the via-holes penetrate the interposer and being filled with a conductive metal.

The sixth aspect of the present invention is successful in connecting the re-wiring of the mounted chips and wirings on the interposer through the via-holes, where the via-holes also serve as a post structure in the chip-mounted portion, in which an insulating film absorbs variation in height of the mounted chips, as well as raising their heat dissipation property. The conductive material is preferably copper which is effective in improving heat dissipation property and high-frequency characteristics.

A seventh aspect of the present invention is a modification of the semiconductor device according to the fourth aspect, where pattern layers of the re-wiring are formed on a planarized insulating layer on the mounted chips, openings are formed in the portions of the insulating film that fell on electrodes of the mounted chips, and the openings are filled with a conductive metal.

The seventh aspect of the present invention is successful in planarizing the chip-mounted portion irrespective of variation in height of the mounted chips.

An eighth aspect of the present invention is a modification of the semiconductor device according to the second aspect, where the interposer has passive elements formed thereon, and the plurality of chips are mounted on the passive elements while placing an insulating protective layer in between. A ninth aspect of the present invention is a modification of the semiconductor device according to the fourth aspect, where passive elements are formed on the re-wiring while placing an insulating film in between.

The eighth and ninth aspects of the present invention are successful in realizing a module capable of housing a large-capacity passive element in an on-chip style, which has never been successful in the past, because the passive element such as a decoupling capacitor can be formed on the interposer, including the substrate on which a large-capacity passive element can be formed, or on the re-wiring.

A method of fabricating a semiconductor device according to a tenth aspect of the present invention comprises a step of forming via-holes having a predetermined depth in an interposer made of one of a silicon substrate, metal substrate and glass substrate; a step of forming a layer of a conductive material on the surface of the interposer, and at the same time filling the conductive material in the via-holes; a step of etching the layer of the conductive material to thereby form a wiring pattern; a step of grinding the interposer from the surface opposite to the surface on which the wiring pattern is formed, to thereby allow the via-holes to be exposed; a step of mounting a plurality of IC chips or chips being passive elements formed on one of a silicon substrate, metal substrate and glass substrate, on the surface of the interposer opposite to the surface on which the wiring pattern is formed, in a face-up manner; a step of forming an insulating film on the mounted chips; and a step of forming a re-wiring pattern for mutually connecting the mounted chips on the insulating film.

The tenth aspect of the present invention is successful in efficiently producing multi-chip modules of a face-up-mounting type, which is advantageous in readily preventing analog-digital interference, by using one of a silicon substrate, metal substrate and a glass substrate on which the large-capacity passive element can be formed, as the interposer, and by forming the re-wiring en bloc. This makes it possible to produce high-frequency devices having a system-in-package (SIP) structure including a large-capacity passive element with a short lead time and at low costs.

An eleventh aspect of the present invention is a modification of the fabrication method according to the tenth aspect, where the method further includes a step of preliminarily grinding and thinning the chips to be mounted on the interposer. The eleventh aspect of the present invention is successful in further miniaturizing the multi-chip module through thinning of the chips to be mounted.

A twelfth aspect of the present invention is a modification of the fabrication method according to the tenth aspect, where the method further includes a step of forming passive elements on the interposer and forming thereon an insulating protective layer, before the chips are mounted.

A thirteenth aspect of the present invention is a modification of the fabrication method according to the tenth aspect, where the method further includes a step of forming passive elements on the re-wiring pattern.

The twelfth and thirteenth aspects of the present invention are successful in forming a large-capacity passive element, such as a decoupling capacitor, that can be formed on the interposer, or on the re-wiring, and thus is realizing a module capable of housing a large-capacity passive element in an on-chip style, which has never been successful in the past.

A fourteenth aspect of the present invention is a modification of the fabrication method according to the tenth aspect, where the method further includes a step of forming openings in portions of the insulating film which falls on electrodes of the mounted chips, and at the same time forming via-holes having a predetermined diameter by opening portions of the insulating film which falls on gaps between the adjacent mounted chips; a step of filling the via-holes and openings with a conductive metal; and a step of planarizing the surface of the insulating film together with the filled conductive metal.

The fourteenth aspect of the present invention is successful in readily mounting chips even they have variation in height, by forming via-holes between adjacent mounted chips, and thus in realizing a SIP having a large heat dissipation.

A fifteenth aspect of the present invention is a modification of the fabrication method according to the tenth aspect, where the method further includes a step of forming external electrodes to the re-wiring pattern, and forming a buffer layer on the re-wiring pattern excluding the portion where the external electrodes are formed.

The fifteenth aspect of the present invention is successful in realizing a highly reliable SIP having all necessary semiconductor devices mounted on one substrate within a short lead time and at low costs, by using one of a silicon substrate, metal substrate and a glass substrate on which the large-capacity passive elements can be formed, as the interposer; by mounting IC chips and so forth in a face-up manner; by providing re-wiring en bloc; and by filling the buffer layer for packaging so as to cover the re-wiring.

BRIEF DESCRIPTION OF THE DRAWINGS

The above and other objects, features and advantages of the present invention will become more apparent from the following description of the presently preferred exemplary embodiment of the invention taken in conjunction with the accompanying drawings, in which.

DETAILED DESCRIPTION OF THE PREFERRED EMBODIMENTS

The next paragraphs will describe embodiments of the present invention referring to the attached drawings.

Figure 1:
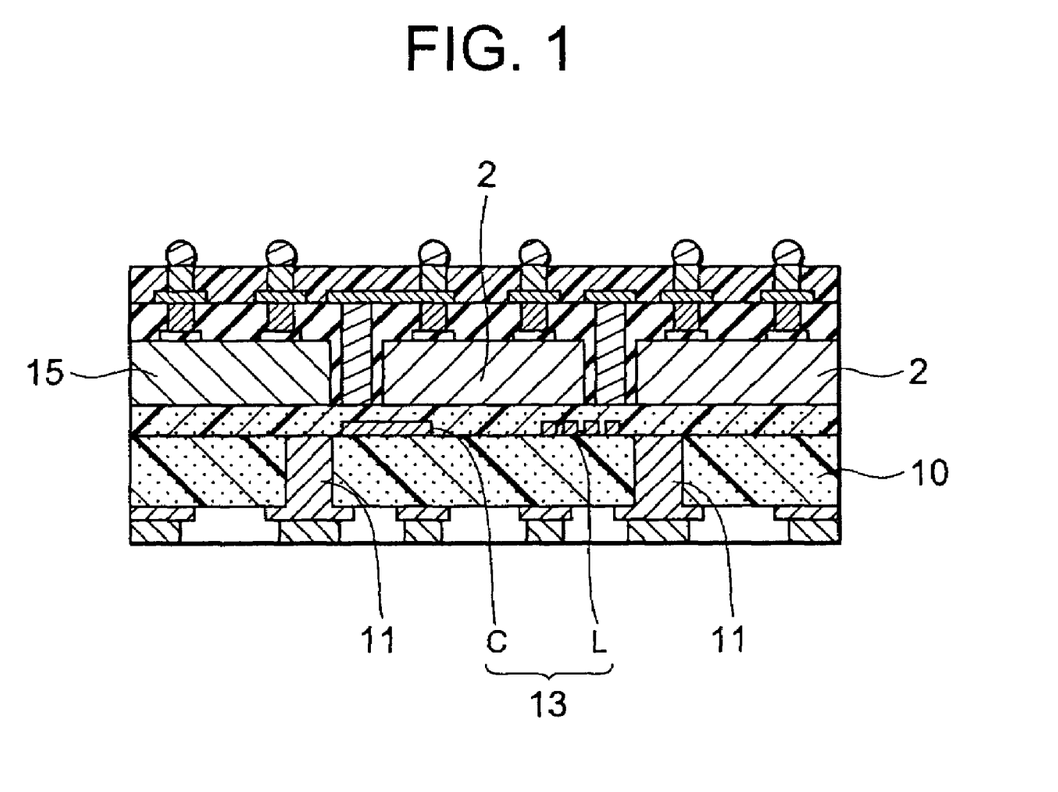
FIG. 1 is a schematic sectional view showing a semiconductor device of an embodiment of the present invention.

FIG. 1 shows a semiconductor device in one embodiment of the present invention. As shown in the drawing, the embodiment adopts a silicon substrate 10 as an interposer, through which via-holes 11 are formed and on which passive elements 13 are formed, and further thereon IC chips 2 and passive elements 15 are mounted in a face-up manner.

The present embodiment will further be detailed with reference to the fabrication process as shown in FIGS. 2A through 4D. First, the interposer which includes the silicon substrate 10 having the via-holes 11 formed therein is fabricated in accordance with FIGS. 2A through 2G.

Figure 2A:
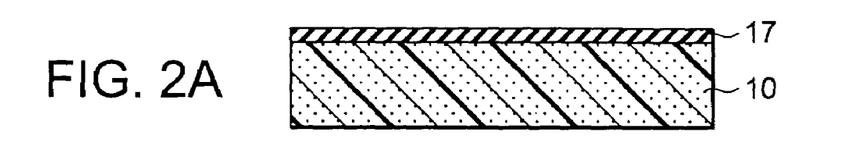
FIGS. 2A through 2G are schematic sectional views showing a fabrication process of the semiconductor device of an embodiment.

As shown in FIG. 2A, on the silicon substrate 10 having an arbitrary specific resistance, an insulating film 17 composed of $SiO_2$ or the like is formed. The formation of the insulating film 17 is performed in a form of wafer by using CVD or thermal oxidation furnace.

Figure 2B:
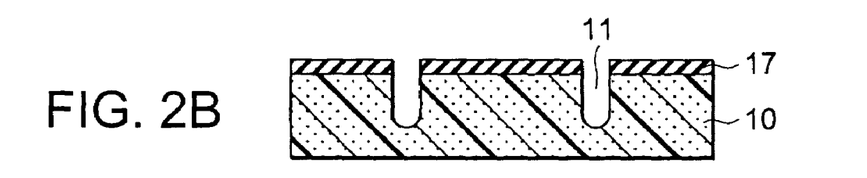
Figure 5:
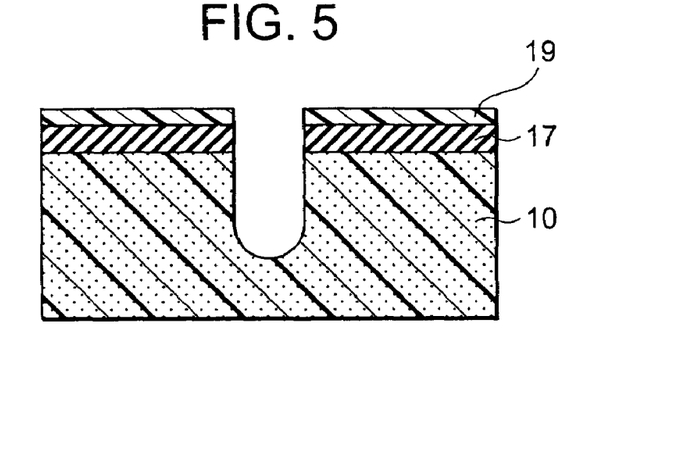
FIG. 5 is a schematic sectional view showing a process of forming a via-hole in a substrate.

Next, as shown in FIG. 2B, the via-holes 11 are formed in the silicon substrate 10. In the formation of the via-holes 11, as shown in FIG. 5, a resist layer 19 is formed on the insulating film 17 and patterned. The substrate 10 is etched at the via-hole formation areas of 30 μm diameter to as deep as 70 μm by dry etching such as RIE.

Figure 2C:
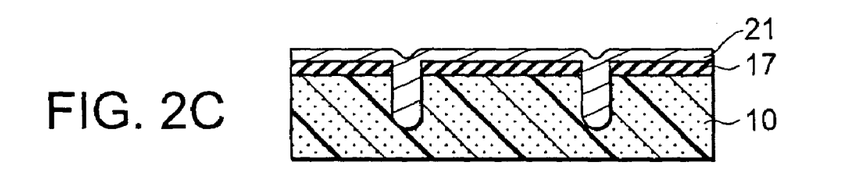
Figure 2D:
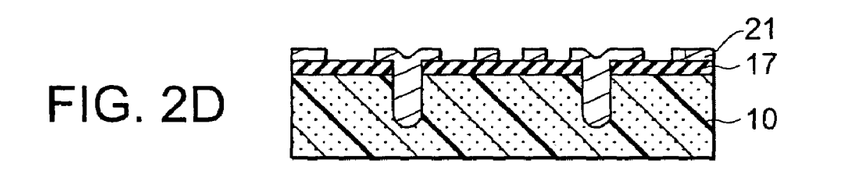

Next, as shown in FIG. 2C, the via-holes 11 are filled with using a connection material such as Cu plated layer or Cu paste and at the same time a conductive layer 21 is formed on the insulating film 17. Then as shown in FIG. 2D, the conductive layer 21 is etched to form a connection pattern for bonding the chips to be mounted with via-holes.

Figure 2E:
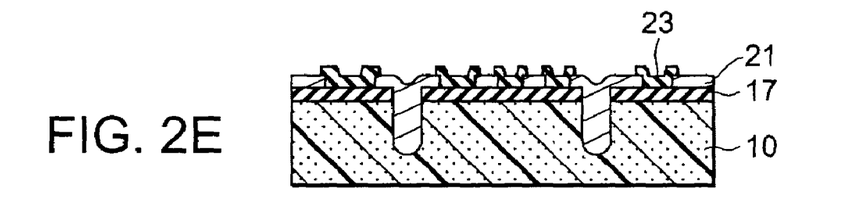
Figure 2F:
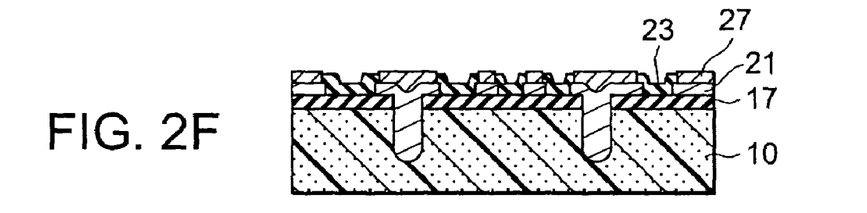

Next, as shown in FIG. 2E, an insulating film 23 is formed on the silicon substrate 10 having the connection pattern already formed thereon. For the case where external electrodes are to be provided to the silicon substrate 10, the insulating film 23 is further etched to form openings in relevant portions including the via-holes 11, and as shown in FIG. 2F, the openings are covered with a TiAu plated film 25 for preventing oxidation.

Figure 2G:
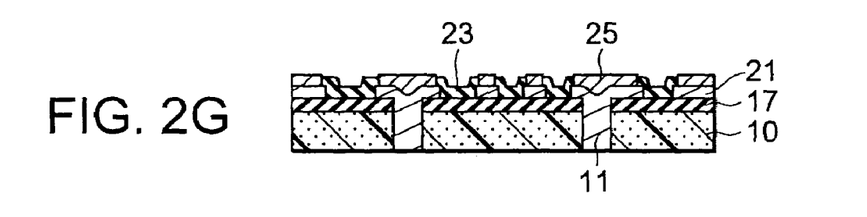

Next, as shown in FIG. 2G, the silicon substrate 10 is ground from the back surface so as to expose the via-holes 11. Thus, an interposer of about 50 μm thickness having the via-holes 11 formed therein is obtained.

In this embodiment, the passive elements 13 are then formed on thus-fabricated interposer, and further thereon the IC chips 2 and passive elements 15 are mounted in a face-up manner. The fabrication process therefor will be explained referring to FIGS. 3A through 3D, and FIGS. 4A through 4D.

Figure 3A:
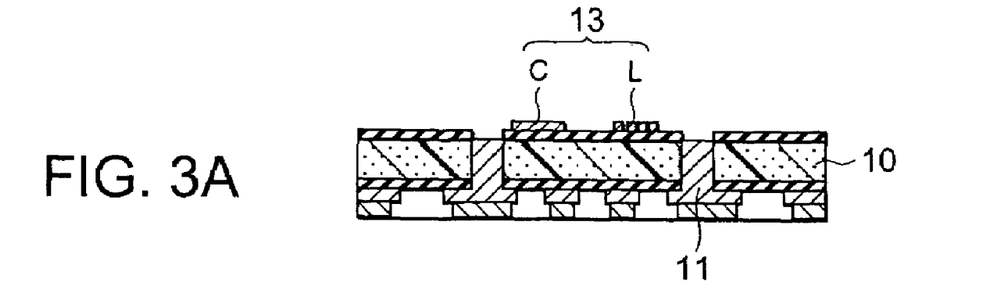
FIGS. 3A through 3D are schematic sectional views showing further fabrication process of the semiconductor device of the embodiment.
Figure 6:
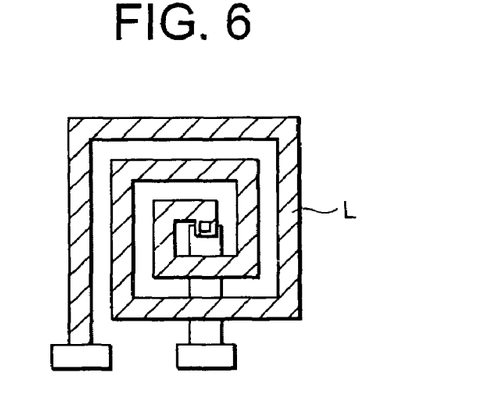
FIG. 6 is a plan view showing an exemplary pattern of an inductor.
Figure 7:
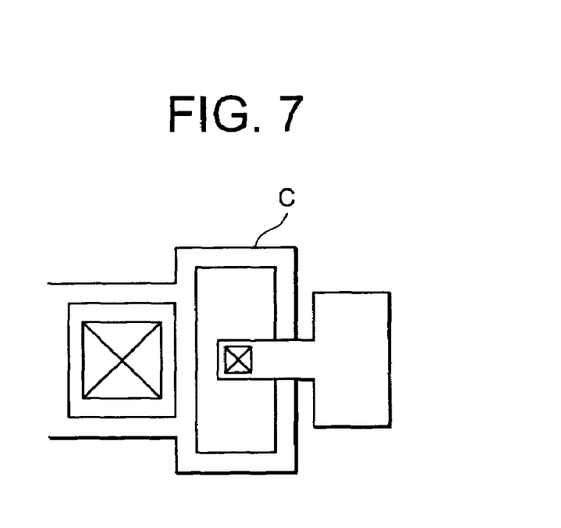
FIG. 7 is a plan view showing an exemplary pattern of a capacitor.
Figure 8:
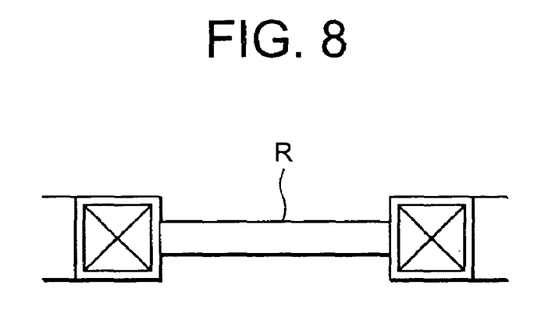
FIG. 8 is a plan view showing an exemplary pattern of a resistor.

As shown in FIG. 3A, the passive elements 13 are formed on the silicon substrate 10 of the interposer. In the formation of the passive elements 13, an insulating film such as $SiO_2$ or the like is deposited in a thickness of 1,000 nm or more on the silicon substrate 10. The insulating film is provided in order to prevent any reaction at the interface with a high-dielectric-constant material during formation of the upper passive elements, and to block electromagnetic flow into the silicon substrate. In the formation area for the capacitor (C), a Ti/Pt film is formed as an underlying electrode in order to prevent metal reaction of the high-dielectric-constant material, and the high-dielectric-constant material layer is formed to a thickness of 0.1 μm or more using Pb (Zr,Ti) $O_3$ (PZT), barium strontium titanate (BST), $SrBi_2Ta_2O_9$ (SBT), $SrTiO_3$ (STO), $Ta_2O_5$ or the like typically by CVD or sputtering. After the film formation, high-temperature annealing typically at around 700° C. is carried out to thereby crystallize the high-dielectric-constant material. The resistor (R) is formed by sputtering of NiCr, TaN, W or the like, which has a large resistivity. The inductor (L) is formed by sputtering of Cu, which has a small resistivity. Exemplary patterns of L, C and R are shown in FIGS. 6 through 8, respectively. The patterning can be carried out by wet etching, milling or the like.

L and C thus mounted on the silicon substrate are selected from those having characteristic values too large to allow them to be embedded within IC chips, where the values are 10 nH or more for L, and 30 pF or more for C. Of course it is also allowable to form L, C and R singularly. In this case, even a relatively small element can be fabricated based on the similar process by forming L only, C only, or R only on a wafer, dicing the wafer and mounting the resultant chips on the silicon substrate, and re-wiring the chip with an IC chip.

Figure 3B:
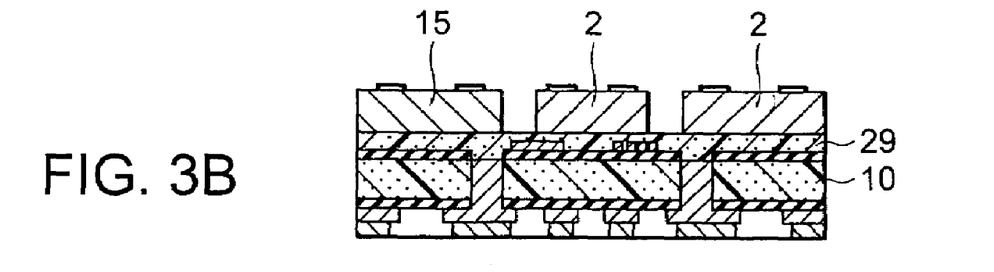

Next, as shown in FIG. 3B, a protective layer 29 is formed typically using epoxy resin, acrylic resin or the like, on the passive elements 13 formed on the silicon substrate 10, and the plurality of IC chips 2 and passive elements 15 are mounted thereon in a face-up manner. The passive elements 15 can be fabricated by forming a high-dielectric-constant material layer or the like on the wafer as described in the above. For the case where the total thickness of the device is restricted, the IC chips 2 and passive elements 15 are ground to as thin as 50 μm, typically by polishing or CMP (chemical-mechanical polishing).

The IC chips 2 are attached on an adhesive sheet or an UV sheet, and subjected to full-cut dicing. Chips to as thick as 140 μm can be picked up by a normal needle push-up method. For the chips having smaller thickness, the UV sheet or adhesive sheet is placed on a vacuum stage of a jig tool having a uneven surface and vacuum suction holes while being evacuated from the back side, and chips are picked-up using a collet after the translation.

When a plurality of chips are mounted, the chips are aligned while keeping a proximity gap of a maximum of 50 μm. The maximum width herein is defined as 50 μm so as to prevent an aspect ratio, which is to be formed in an insulating material filled in the gap, from increasing beyond 1, because the mounted chips and passive elements are possibly thinned to as small as 50 μm.

Figure 3C:
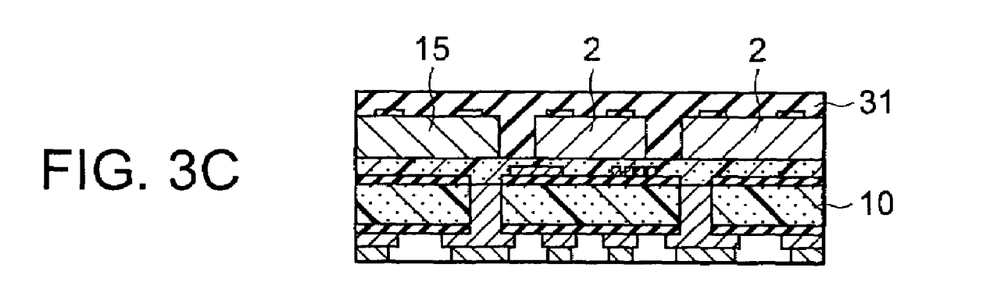

Next, as shown in FIG. 3C, the entire portion where the IC chips 2 and passive elements 15 are mounted is covered with an insulating material such as photo-sensitive PI, PA, BCB, PBO or the like, to thereby form an insulating film 31.

Figure 3D:
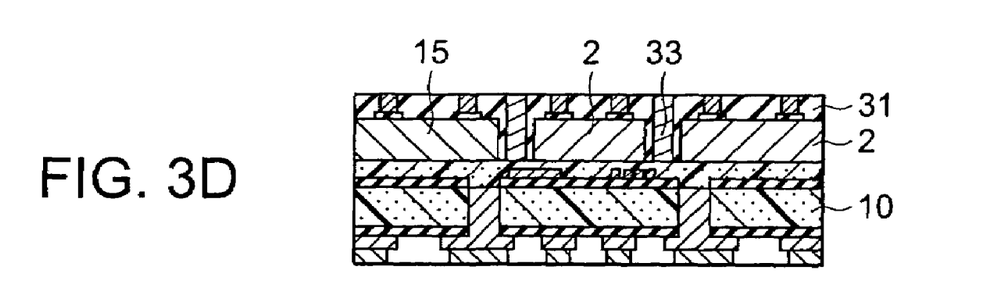
Figure 9:
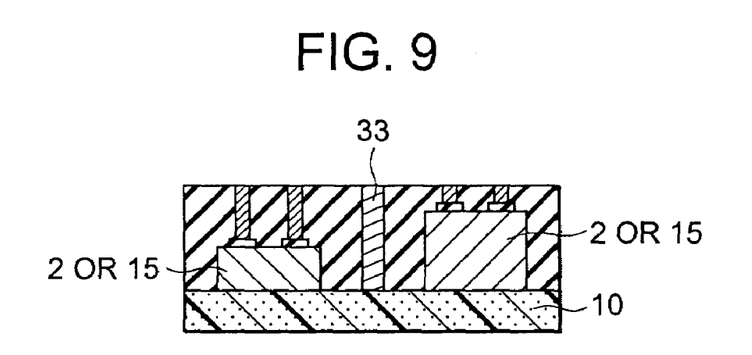
FIG. 9 is a schematic sectional view showing an exemplary pattern of a post structure.

Next, as shown in FIG. 3D, openings are formed in the insulating film 31 by light exposure effected in the gaps between the mounted chips and on electrodes of the chips, the openings are filled with a Cu plated film, and the surface of the device is planarized by grinding. This process completes a post structure as shown in FIG. 9, in which the via-holes 33 are filled with copper, and the insulating film 31 can successfully absorb variation in thickness of the mounted IC chips 2 and passive elements 15. It is also allowable to replace the Cu plated film with Au stud bumps or a conductive paste film.

Figure 4A:
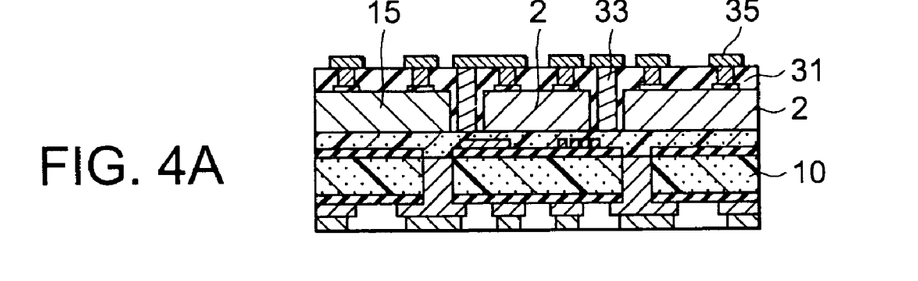
FIGS. 4A through 4D are schematic sectional views showing still further fabrication process of the semiconductor device of the embodiment.

Next, in FIG. 4A, Cu plating and patterning of the plated film are carried out on the planarized surface in order to form a re-wiring 35 for between the mounted chips and passive elements. The re-wiring 35 can be patterned to as fine as 5 μm/5 μm in terms of line (L) and space (S) so as to facilitate characteristic impedance control. An inductor (L) connected to the re-wiring 35 can be formed by patterning a Cu layer. A capacitor (C) can be formed by depositing an insulating film on the re-wiring 35, and by forming a high-dielectric-constant material layer by CVD, sputtering or the sol-gel process. The upper side of the re-wiring 35 is molded with a protective layer composed of an epoxy resin, acrylic resin or the like.

Figure 4B:
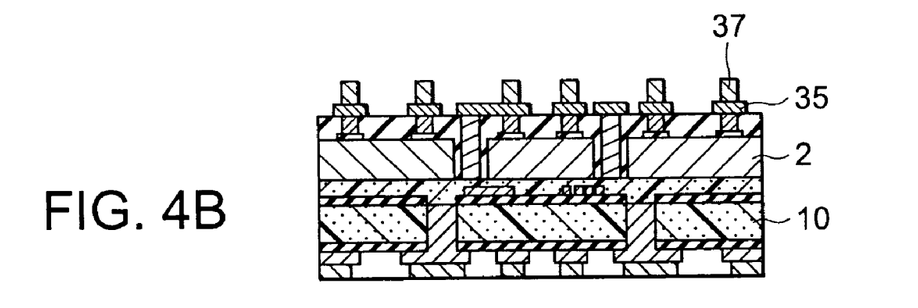
Figure 4C:
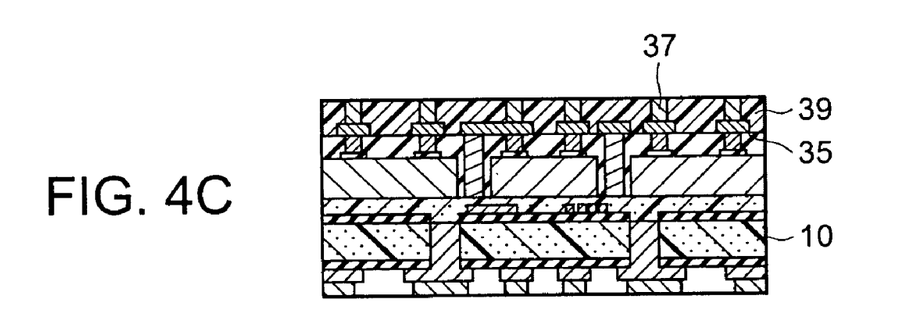
Figure 4D:
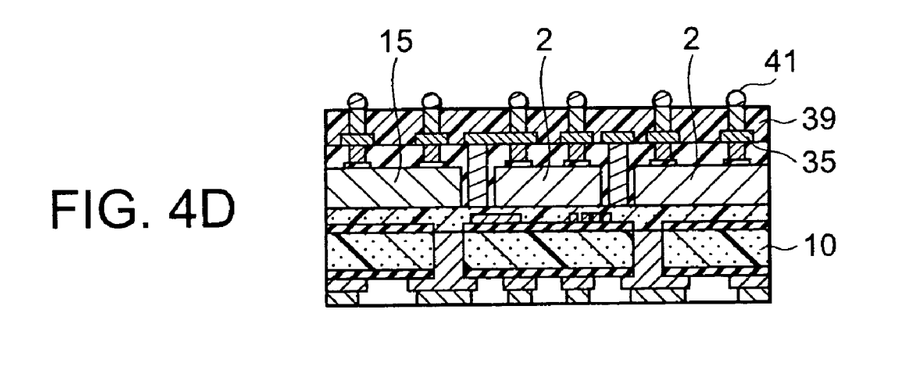

On the other hand, for the case where external electrodes are to be formed on the re-wiring 35, a TiAu plated film 37 is formed, as shown in FIG. 4B, in portions where the external electrodes are to be formed, and a buffer layer 39 is formed using epoxy resin, acrylic resin or the like so as to obtain a chip-sized package (CSP) structure, as shown in FIG. 4C. The buffer layer 39 is then planarized by grinding as shown in FIG. 4D, bumps 41 (external electrodes) are formed on the TiAu plated film 37. A system-in-package (SiP) having a CSP structure such as LGA (land grid array) or BGA (ball grid array) is thus completed.

As has been described in the above, the present embodiment is successful in realizing the multi-chip module having a shorter wiring length for the chips, a smaller wiring resistance, and an excellent high-frequency characteristics in a more miniaturized form by mounting a plurality of IC chips and passive elements in a face-up manner and by wiring them en bloc, and is also successful in reducing digital-analog interference because wirings on the substrate and re-wiring on the chip side can be brought apart. Use of a silicon substrate, which is durable against high-temperature annealing for crystallizing high-dielectric-constant material, not only for an interposer of a multi-chip module, but also for passive elements makes it possible to increase capacities of a capacitor and an inductor, and to realize a high-frequency device in need of large-capacity capacitor for decoupling system and inductor, with an SIP structure. In addition, formation of gaps filled with an insulating material between adjacent chips and formation of via-holes having the post structure can facilitate mounting of IC chips and passive elements having variation in height, and can realize an SIP excellent in heat dissipation property. Moreover, mounting of thinned chips in a face-up manner on a substrate having via-holes already formed therein can successfully thin the mult-chip module, and can realize three-dimensional multilayer based on bonding.

While the silicon substrate was used in the aforementioned embodiment, a metal substrate or glass substrate, durable against high-temperature annealing for crystallizing high-dielectric-constant materials, can be used similarly to the silicon substrate.

Figure 10:
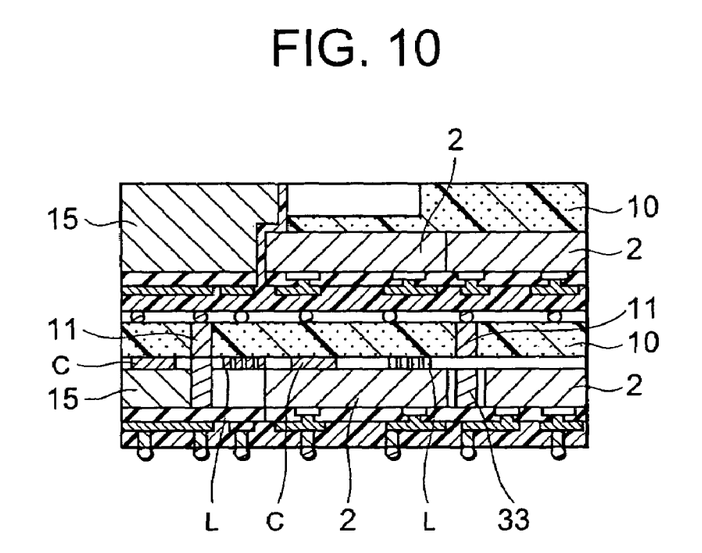
FIG. 10 is a schematic sectional view showing an embodiment of the present invention allowing use of a multi-LAN card shown in FIGS. 11A and 11B.
Figure 11A:
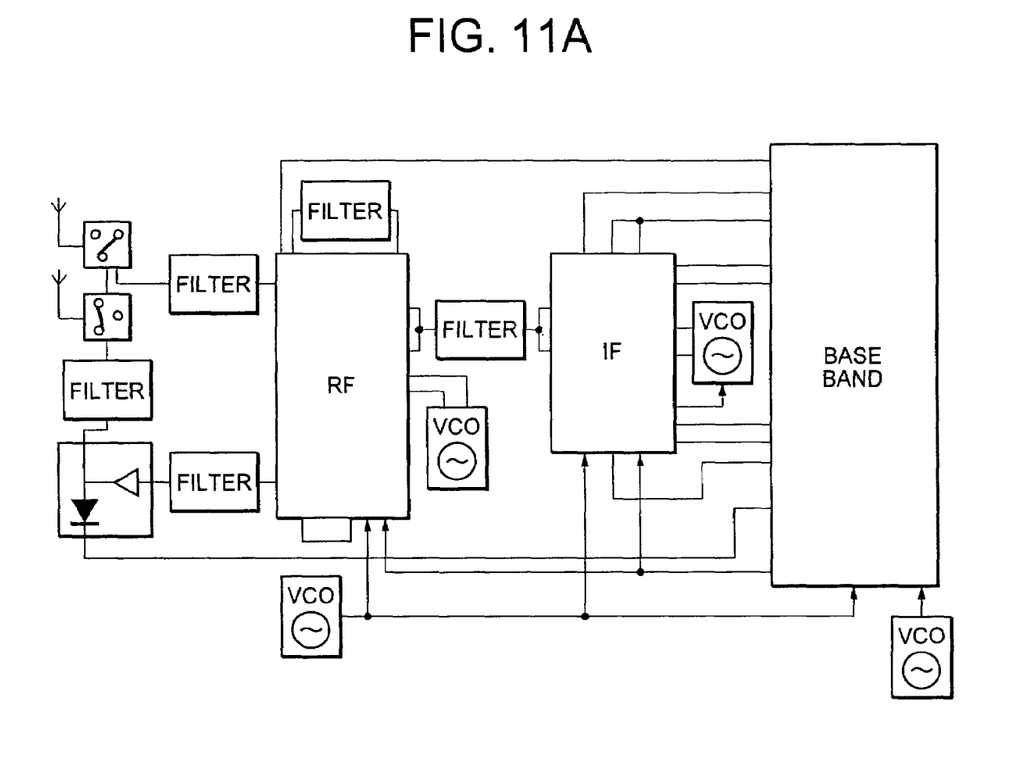
FIGS. 11A and 11B are block diagrams of the multi-LAN card.
Figure 11B:
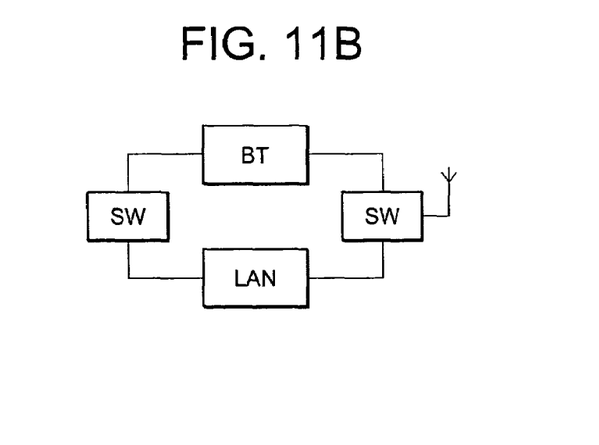

Other embodiments of the present invention are shown in FIGS. 10, 12, 13 and 14. FIG. 10 shows an SiP in which a multi-LAN card, illustrated by block diagrams shown in FIGS. 11A and 11B, is formed on the silicon substrate 10. As is obvious from FIG. 10, the present invention, capable of mounting all necessary RF modules on a silicon substrate, can realize a highly-reliable SiP in a short lead time from start to end of the production, at low costs.

Figure 12:
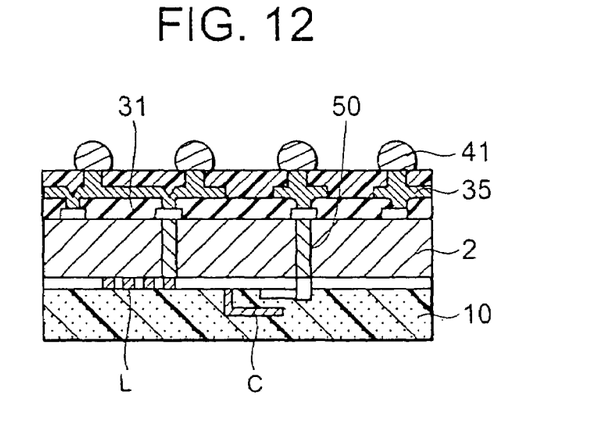
FIG. 12 is a schematic sectional view showing another embodiment of the present invention.
Figure 13:
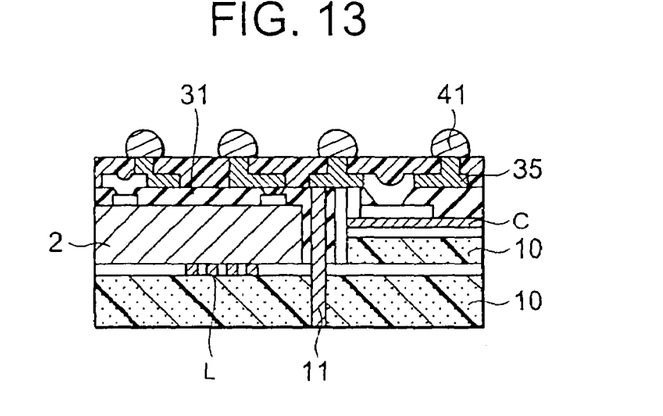
FIG. 13 is a schematic sectional view showing still another embodiment of the present invention.
Figure 14:
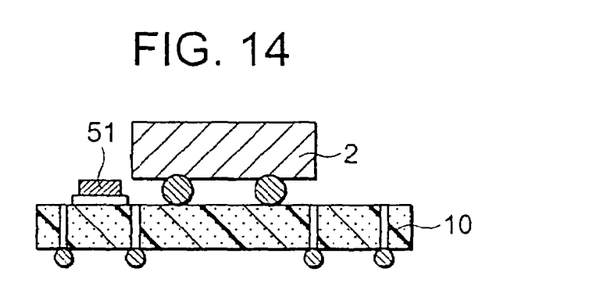
FIG. 14 is a schematic sectional view showing still another embodiment of the present invention.

FIG. 12 shows a structure in which via-holes 50 are formed in the IC chip 2, and the passive elements (L, C) are formed on the silicon substrate 10. FIG. 13 shows a structure in which the IC chip 2 and passive elements formed on a silicon substrate are mounted on the silicon substrate 10 having the inductor (L) already formed thereon, and are allowed to be connected through the re-wiring 35. FIG. 14 shows a structure in which the IC chip 2 is connected in a flip-chip manner on the silicon substrate 10 having the via-holes 11 already formed therein, a chip components 51 such as a chip-formed capacitor is mounted, and a BGA structure is realized after pitch conversion.

Finally, the embodiments and examples described above are only examples of the present invention. It should be noted that the present invention is not restricted only to such embodiments and examples, and various modifications, combinations and sub-combinations in accordance with its design or the like may be made without departing from the scope of the present invention.

What is claimed is:

1. A method of fabricating a semiconductor device comprising:
    a step of forming via-holes having a predetermined depth in an interposer comprising one of a silicon substrate, metal substrate and glass substrate;
    a step of forming a layer of a conductive material on the surface of said interposer, and at the same time filling said conductive material in said via-holes;

a step of etching said layer of the conductive material to thereby form a wiring pattern;

a step of grinding said interposer from the surface opposite to the surface on which said wiring pattern is formed, to thereby allow said via-holes to expose;

a step of mounting a plurality of IC chips or chips being passive elements formed on one of a silicon substrate, metal substrate and glass substrate, on the surface of said interposer opposite to the surface on which said wiring pattern is formed, in a face-up manner;

a step of forming an insulating film on said mounted chips;

a step of forming a re-wiring pattern for mutually connecting said mounted chips on said insulating film;

a step of forming openings in portions of said insulating film which falls on electrodes of said mounted chips, and at the same time forming via-holes having a predetermined diameter by opening portions of said insulating film which falls on gaps between the adjacent mounted chips;

a step of filling openings including said via-holes with a conductive metal; and a step of planarizing the surface of said insulating film together with said filled conductive metal, wherein said conductive metal is copper.

2. The method of fabricating a semiconductor device as claimed in claim 1, further comprising a step of preliminarily grinding and thinning said chips to be mounted on said interposer.

3. The method of fabricating a semiconductor device as claimed in claim 1, further comprising a step of forming passive elements on said interposer and forming thereon an insulating protective layer, before said chips are mounted.

4. The method of fabricating a semiconductor device as claimed in claim 1, further comprising a step of forming passive elements on said re-wiring pattern.

5. The method of fabricating a semiconductor device as claimed in claim 1, further comprising a step of forming external electrodes to said re-wiring pattern, and forming a buffer layer on said re-wiring pattern excluding the portion where said external electrodes are formed.

6. The method of fabricating a semiconductor device as claimed in claim 1, wherein said passive elements are formed on the substrate of the same kind as said interposer on which said passive elements are mounted.

7. The method of fabricating a semiconductor device as claimed in claim 1, wherein said re-wiring is composed of copper.

8. A method of fabricating a semiconductor device comprising:

forming a via-hole in an interposer;

filling said via-hole with a connection material;

removing a portion of said interposer, said portion being opposite a first surface of said interposer, removal of said portion exposing a second surface of said interposer and said connection material; and forming a passive element on said second surface forming an opening in a portion of an insulating film which falls on the electrode of a mounted chip, and at the same time forming a via-hole having a predetermined diameter by opening portions of said insulating film which falls on gaps between adjacent mounted chips;

filling said opening including said via-hole with a conductive metal; and planarizing the surface of said insulating film together with said filled conductive metal, wherein said conductive metal is copper.

9. The method of fabricating a semiconductor device as claimed in claim 8, wherein said interposer is from the group consisting of a silicon substrate, metal substrate and glass substrate.

10. The method of fabricating a semiconductor device as claimed in claim 8, wherein, in the step of forming said via-hole, said via-hole terminates within said interposer.

11. The method of fabricating a semiconductor device as claimed in claim 8, further comprising:

forming an insulating film on said imposer, said via-hole extending through said insulating film.

12. The method of fabricating a semiconductor device as claimed in claim 11, wherein the step of forming said via-hole includes:

forming a resist layer on said insulating film; and etching said imposer at a via-hole formation area, said resist layer being an etching mask.

13. The method of fabricating a semiconductor device as claimed in claim 8, further comprising:

forming a conductive layer on said first surface of said interposer and said connection material; and etching said conductive layer, the etched conductive layer being a connection pattern.

14. The method of fabricating a semiconductor device as claimed in claim 13, wherein said connection material is in contact with said conductive layer.

15. The method of fabricating a semiconductor device as claimed in claim 8, wherein, in the step of removing said portion, said portion is removed by grinding.

16. The method of fabricating a semiconductor device as claimed in claim 8, further comprising:

forming an IC chip on said second surface.

17. The method of fabricating a semiconductor device as claimed in claim 8, further comprising:

forming an IC chip, said passive element being between said IC chip and said interposer.

18. The method of fabricating a semiconductor device as claimed in claim 8, further comprising:

forming an insulating film on said second surface, said passive element being formed on said insulating film.

19. The method of fabricating a semiconductor device as claimed in claim 8, wherein said passive element is from the group consisting of a capacitor, and inductor, and a resistor.

20. The method of fabricating a semiconductor device as claimed in claim 8, further comprising:

forming a protective layer on said passive element.

21. The method of fabricating a semiconductor device as claimed in claim 20, wherein said protective layer is a resin.

* * * * *